United States Patent [19]

Kmetz

[11] 4,253,096
[45] Feb. 24, 1981

[54] METHOD FOR ADDRESSING AN ELECTRO-OPTICAL DEVICE, AND AN ADDRESSING CIRCUIT AND A DISPLAY DEVICE FOR CARRYING OUT THE METHOD

[75] Inventor: Allan R. Kmetz, Nussbaumen, Chatham, N.J.

[73] Assignee: BBC Brown, Boveri & Company, Limited, Baden, Switzerland

[21] Appl. No.: 895,667

[22] Filed: Apr. 12, 1978

[30] Foreign Application Priority Data

Jul. 1, 1977 [CH] Switzerland .................. 8096/77

[51] Int. Cl.³ .............................................. G06F 3/14
[52] U.S. Cl. ................................. 340/753; 340/798; 340/803; 350/357; 364/573
[58] Field of Search ........ 340/324 EC, 324 M, 324 R, 340/336, 753, 798, 799, 803; 350/357; 364/573

[56] References Cited

U.S. PATENT DOCUMENTS

| | | | |
|---|---|---|---|
| 3,275,871 | 9/1966 | Yiotis | 340/753 |
| 3,525,091 | 8/1970 | Lally | 340/324 R |
| 3,644,784 | 2/1972 | Dickey | 340/753 |
| 3,922,667 | 11/1975 | Ueda et al. | 340/324 M |
| 3,987,433 | 10/1976 | Kennedy | 350/357 |
| 3,987,617 | 10/1976 | Slob | 340/324 M |
| 4,127,848 | 11/1978 | Shanks | 340/799 |
| 4,149,120 | 4/1979 | Richter | 364/573 |

Primary Examiner—Marshall M. Curtis
Attorney, Agent, or Firm—Oblon, Fisher, Spivak, McClelland & Maier

[57] ABSTRACT

A method for addressing an electro-optical display device having a display comprising display elements which adjoin one another and are arranged in a row, each display element having two electrodes of two different types which are opposite one another and are separated from one another by a liquid crystal. The electrodes of the first type are connected to one another groupwise in an electrically conducting manner and the electrodes of the second types are connected to one another segment-wise in an electrically conducting manner. For pointer-type representation of data on a contrasting background, at least three rectangular signals which are of the same type but out of phase with one another are applied via an adressing circuit to the electrodes of the display elements in such a way that in-phase signals are applied to the group electrode and the segment electrode of at least one data bearing element and signals which are out of phase with one another are applied to the group electrodes and segment electrodes of the elements forming the background, the signals being such that the voltage between the electrodes of each of the other elements is greater than the threshold voltage of the liquid crystal. Also disclosed are an addressing circuit and a display device for carrying out the abovementioned method.

3 Claims, 11 Drawing Figures

| INPUT ADDRESS | OUTPUTS FOR THE SEGMENT ELECTRODES | | | | | | | | OUTPUTS FOR THE GROUP ELECTRODES | | | | | | | |
|---|---|---|---|---|---|---|---|---|---|---|---|---|---|---|---|---|
| | 1 | 2 | 3 | 4 | 5 | 6 | 7 | 8 | 1 | 2 | 3 | 4 | 5 | 6 | 7 | 8 |
| 0 | | | | * | * | * | * | * | | | | | | | | |
| 1 | | * | * | | | | | | * | | | | | | | |
| 2 | * | | | | | | | | | | | | | | | |
| 3 | | | | | | | | | | * | * | * | * | * | * | * |
| 4 | | * | | | * | * | * | * | | | | | | | | |
| 5 | * | | * | * | | | | | | * | | | | | | |
| 6 | | | | | | | | | * | | | | | | | |
| 7 | | | | | | | | | | | * | * | * | * | * | * |
| 8 | | | * | | | * | * | * | | | | | | | | |
| 9 | * | * | | * | * | | | | | | * | | | | | |
| 10 | | | | | | | | | | * | | | | | | |
| 11 | | | | | | | | | * | | | * | * | * | * | * |
| 12 | * | | | * | | | * | * | | | | | | | | |
| 13 | | * | * | | * | * | | | | | | | * | | | |
| 14 | | | | | | | | | | | | * | | | | |
| 15 | | | | | | | | | * | * | | | * | * | * | * |
| 16 | * | * | | | * | | * | | | | | | | | | |
| 17 | | | * | * | | * | * | | | | | | * | | | |
| 18 | | | | | | | | | | | | * | | | | |
| 19 | | | | | | | | | | * | * | * | | | * | * |
| 20 | * | * | * | | | * | | | | | | | | | | |
| 21 | | | | * | * | | * | * | | | | | | * | | |
| 22 | | | | | | | | | | | | | * | | | |
| 23 | | | | | | | | | | * | * | * | * | | * | * |

FIG. 7B

| INPUT ADDRESS | OUTPUTS FOR THE SEGMENT ELECTRODES | | | | | | | | OUTPUTS FOR THE GROUP ELECTRODES | | | | | | | |
|---|---|---|---|---|---|---|---|---|---|---|---|---|---|---|---|---|
| | 1 | 2 | 3 | 4 | 5 | 6 | 7 | 8 | 1 | 2 | 3 | 4 | 5 | 6 | 7 | 8 |
| 24 | * | * | * | * | | | * | | | | | | | | | |
| 25 | | | | | * | * | | * | | | | | | | * | |
| 26 | | | | | | | | | | | | | | * | | |
| 27 | | | | | | | | | | * | * | * | * | * | | * |
| 28 | * | * | * | * | * | | | | | | | | | | | |
| 29 | | | | | | * | * | | | | | | | | | * |
| 30 | | | | | | | * | | | | | | | | * | |
| 31 | | | | | | | | | | * | * | * | * | * | | |
| 32 | * | * | * | * | * | | | | | | | | | | | |
| 33 | | | | | | * | * | | * | | | | | | | |
| 34 | | | | | | | * | | | * | | | | | | |
| 35 | | | | | | | | | | | * | * | * | * | * | * |
| 36 | * | * | * | * | | | * | | | | | | | | | |
| 37 | | | | | * | * | | * | | * | | | | | | |
| 38 | | | | | | | | | | | * | | | | | |
| 39 | | | | | | | | | * | | | * | * | * | * | * |
| 40 | * | * | * | | * | | | | | | | | | | | |
| 41 | | | * | * | | * | | | | * | | | | | | |
| 42 | | | | | | | | | | | | * | | | | |
| 43 | | | | | | | | | * | * | | * | * | * | * | |
| 44 | * | * | | * | | * | | | | | | | | | | |
| 45 | | * | * | | * | * | | | | | | * | | | | |
| 46 | | | | | | | | | | | | | * | | | |
| 47 | | | | | | | | | | * | * | * | | * | * | * |
| 48 | * | | * | | * | * | | | | | | | | | | |

FIG. 7C

| INPUT ADDRESS | OUTPUTS FOR THE SEGMENT ELECTRODES | | | | | | | | OUTPUTS FOR THE GROUP ELECTRODES | | | | | | | |
|---|---|---|---|---|---|---|---|---|---|---|---|---|---|---|---|---|
| | 1 | 2 | 3 | 4 | 5 | 6 | 7 | 8 | 1 | 2 | 3 | 4 | 5 | 6 | 7 | 8 |
| 49 |  | * | * |  | * | * |  |  |  |  |  |  | * |  |  |  |
| 50 |  |  |  |  |  |  |  |  |  |  |  |  |  | * |  |  |
| 51 |  |  |  |  |  |  |  |  | * | * | * | * |  |  | * | * |
| 52 |  |  | * |  |  | * | * | * |  |  |  |  |  |  |  |  |
| 53 | * | * |  | * | * |  |  |  |  |  |  |  | * |  |  |  |
| 54 |  |  |  |  |  |  |  |  |  |  |  |  |  | * |  |  |
| 55 |  |  |  |  |  |  |  |  | * | * | * | * | * |  |  | * |
| 56 |  | * |  |  | * | * | * | * |  |  |  |  |  |  |  |  |
| 57 | * |  | * | * |  |  |  |  |  |  |  |  |  | * |  |  |
| 58 |  |  |  |  |  |  |  |  |  |  |  |  |  |  |  | * |
| 59 |  |  |  |  |  |  |  |  | * | * | * | * | * | * |  |  |
| 60 |  |  |  |  | * | * | * | * |  |  |  |  |  |  |  |  |
| 61 |  | * | * |  |  |  |  |  |  |  |  |  |  |  |  | * |
| 62 | * |  |  |  |  |  |  |  |  |  |  |  |  |  |  |  |
| 63 |  |  |  |  |  |  |  |  | * | * | * | * | * | * | * |  |

METHOD FOR ADDRESSING AN ELECTRO-OPTICAL DEVICE, AND AN ADDRESSING CIRCUIT AND A DISPLAY DEVICE FOR CARRYING OUT THE METHOD

BACKGROUND OF THE INVENTION

The present invention relates to a method for addressing an electro-optical display device having a display comprising display elements which adjoin one another and are arranged in a row. The invention also relates to a drive circuit and a display device for carrying out the abovementioned method.

A method of the abovementioned type is known from the article by W. G. Freer, "Current Liquid Crystal Display Technology" in Microelectronics and Reliability, volume 15, pages 15-21, Pergamon Press 1976. With this method one display element which carries the data in a display device in which the individual display elements adjoin one another and are arranged in a row is supplied with in-phase voltage pulses and the other display elements are activated with out-of-phase voltage pulses so that a dark pointer-like display on a light background is produced. In particular, in the case of display devices with high resolution, the readability of display devices addressed in this way is, however, not adequate since the sole triggered element which carries the data is discernible only on looking very closely and in some cases can no longer be perceived at all from greater distances.

An improvement in the readability with the display device mentioned above can be achieved by triggering the upper or lower portion of the display elements arranged in a row as a bar display. However, this necessitates a relatively complicated addressing method.

An addressing method with which N strobe voltages are applied to the N row electrodes of display elements arranged in a matrix and M signal voltages are applied to the M column electrodes of these elements, these voltages having a value other than 0 only during the time interval $t_j = 1/N \cdot T$, where T is the period of these voltages and j ranges through all the natural numbers $\leq$ N is known from German Offenlegungsschrift No. 2,414,608. With this method one display element in each one of the M columns of the display elements arranged in a matrix is left dark on a light background. Since all of the selected display elements are rendered visible at the same time, this method is particularly suitable for the representation of single-valued graphs on plane surfaces.

SUMMARY OF THE INVENTION

Accordingly, one object of this invention is to provide a novel method for addressing display devices in which the display elements are arranged in a row and with which the data are reproduced in pointer form on a contrasting background.

It is another object of this invention to provide such a method wherein the readability of the data shown becomes comparable to the readability of the data shown in a display device addressed to give a bar display.

It is yet a further object of this invention to provide a novel addressing circuit and display device for carrying out such a method.

The objects of the invention are achieved by a method wherein at least two display elements which carry the data and are separated from one another at most by one activated display element are simultaneously driven by in phase, unipolar voltage pulses of the same amplitude, period and pulse width applied to the group electrodes and segment electrodes, the pulse width being at most one third of the pulse period and the phase displacement being at least equal to the pulse width.

In another aspect, the present invention involves a display device wherein the group electrodes are connected to the outputs of a first read-only memory and the segment electrodes are connected to the outputs of a second read-only memory. Also involved is a data memory with digital storage of the data to be shown, whose outputs containing the group electrode data are in contact with the inputs of the first read-only memory and whose outputs containing the segment electrode data are in contact with the inputs of the second read-only memory.

The main advantage of the method according to the invention is that the readability of the electro-optical display devices which are addressed according to the invention and reproduce the data in pointer form is not only superior to the readability of electro-optical display devices known hitherto which reproduce the data in pointer form but, moreover, is even comparable with the readability of display devices which show the data in bar form. Since the method according to the invention is also distinguished by simple addressing steps, it is also possible to install particularly economical and reliable electronic components in display devices for carrying out the method according to the invention.

In order to increase the speed of readability, it is advantageous to address all the display elements, except for one activated display element carrying the detailed data, of a group simultaneously in phase and it proves particularly appropriate to mark the display elements located at the ends of each group in a particular way and to design these, say, as pointers pointing towards the inside of the group or to enlarge them relative to the display elements located within the group.

It is highly advisable to apply a total of up to four different out-of-phase pulses, the pulse width ($\tau$) of which is at most one quarter of the period (T), to the group electrodes and segment electrodes, at least three different pulses of these being applied, in each case, to the group electrodes and to the segment electrodes when the pointer passes from the elements of one group to the elements of an adjacent group. Display devices addressed in this way are distinguished by the fact that the pointer can move, with an approximately constant width, from one group to another. In order to obtain a pointer having the width of one group, the width of which remains constant everywhere, it is advantageous in this case to use segment electrodes in which the front electrodes of corresponding display elements for all groups are connected to one another.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
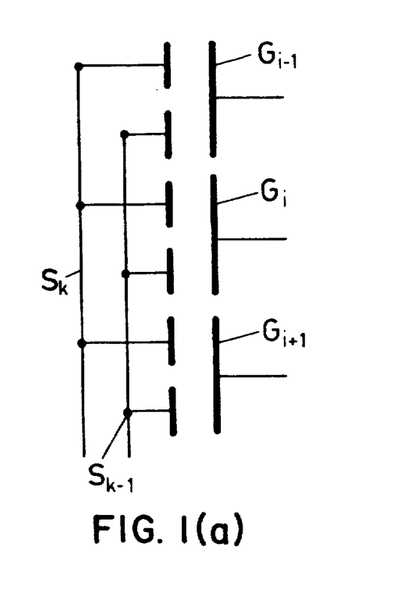
FIG. 1a shows a cross-over arrangement of the electrodes of the display elements of an electro-optical display device, which is part of the state of the art.
Figure 1B:
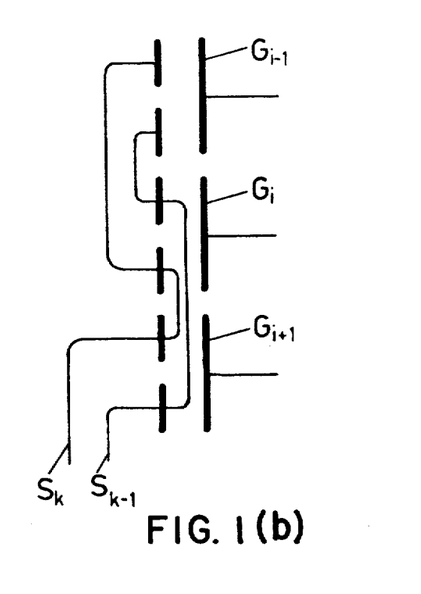
FIG. 1b shows a meander-type arrangement of the electrodes of the display elements of an electro-optical display device.

Referring now to the drawings, wherein like reference numerals designate identical or corresponding parts throughout the several figures and more particularly to FIGS. 1a and 1b thereof, there is shown the electro-optical displays consisting of display elements arranged in a row. In this case, the display elements are formed by the electrodes $G_iS_k$, $G_iS_{k-1}$, $G_iS_{k+1}$, ... and the like, which are opposite one another. A liquid crystal layer, which is not shown, is located between the electrodes. The way in which the various display elements $G_iS_k$, $G_iS_{k-1}$ and the like can be connected to one another in an electrically conducting manner in order to reduce the number of address lines can be seen from FIGS. 1a and 1b. The back electrodes $G_i$, $G_{i-1}$ and $G_{i+1}$ of each group of adjacent elements, for example $G_iS_k$ and $G_iS_{k-1}$ or $G_{i-1}S_k$ and $G_{i-1}S_{k-1}$ have been formed by connecting the back electrodes of these elements and are termed group electrodes. The segment electrodes $S_k$ and $S_{k-1}$ result from the connection of the front electrodes of one display element from each group of display elements. Since the electro-optical display can comprise any desired number N of group electrodes and M of segment electrodes, only the electrodes $G_{i-1}$, $G_i$, $G_{i+1}$, $S_{k-1}$ and $S_k$ are shown in FIG. 1 as representative of all the groups $G_1$, ..., $G_N$ and segment electrodes $S_1$, ..., $S_M$. Connection of the segment electrodes in accordance with FIG. 1a necessitates the lines crossing at a large number of points. These cross-over points can be avoided by using the meander-type connections according to FIG. 1b.

Figure 2A:
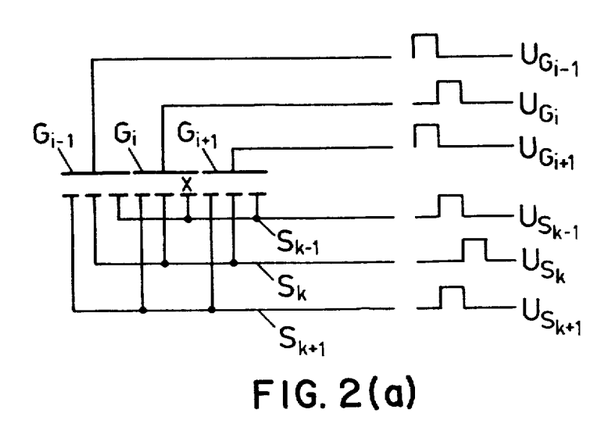
FIG. 2a shows a schematic representation of the method according to the invention for addressing all the display element of a selected group except for the element carrying the detailed data.

FIG. 2a shows a display having display elements formed from the group electrodes and segment electrodes $G_{i-1}$, $G_i$ and $S_{i-1}$, $S_k$ and $S_{k+1}$. Analogously to FIGS. 1a and 1b, only a few of the total N group electrodes and M segment electrodes are drawn. Out-of-phase unipolar rectangular voltage pulses which are of a constant type and have a pulse amplitude U, a period T and a width $\tau$ are applied via an addressing circuit to the group electrodes and segment electrodes $G_i$; i=1, ..., N and, respectively, $S_k$; k=1, ..., M, the pulse width being about one quarter, but at most one third, of the pulse period T and the phase displacement of the three different pulses $U_{G_{i-1}}$ (=$U_{G_{i+1}}$), $U_{G_i}$ (=$U_{S_{k+1}}$) and $U_{S_k}$ being at least equal to the pulse width $\tau$. Identical signals $U_{G_i}=U_{S_{k-1}}=U_{S_{k+1}}$ are applied to the elements $G_iS_{k+1}$ and $G_iS_{k-1}$ of the group $G_i$. The addressing pulses of the group electrodes and of the segment electrodes are completely superimposed on each of these elements, so that the potential difference in the liquid crystal layer of these elements disappears and an observer sees only a dark area. A single element $G_iS_k$ from this group and also all of the other elements of all of the other groups $G_j$, where j=1, ..., N and J≠i are driven by pulses which are out-of-phase relative to $U_{G_i}$ and $U_{S_k}$. An alternating voltage is therefore applied to the liquid crystal layer of these elements and this prevents electro-chemical decomposition and at the same time effects activation of the liquid crystal. A potential difference $U_{RmS}$ greater than the threshold voltage $U_o$ of the liquid crystal is necessary for activation. The pulses are so chosen that $U_{RmS}=U\sqrt{2\tau/T} \geq U_o$. Adequately activated display elements, which therefore are discerned as a light background by an observer, result with pulses of such dimensions.

A characteristic feature of the display device addressed according to the invention is that an observer can recognize at first glance, even from large distances, which group has been selected since, with the exception of a single element, all the elements in that group are dark. As a result of this the gross readability of the display device addressed according to the invention is comparable with the readability of a display device triggered to give a bar display. Since, however, a single element of the selected group is, in addition, so addressed that it carries the detailed data and on closer observation can be discerned as a light area on the dark background of the selected group, the display device addressed according to the invention has both the advantages of good readability of a display device addressed to give a column type display and also the accuracy and simplicity of addressing of a display device addressed to give a pointer display indicated by a single element.

Figure 2B:
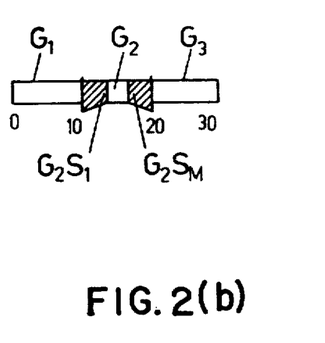
FIG. 2b shows a scale of a selected group of display elements wherein all elements are selected except the desired element.

The readability can be increased by a suitable design of the display elements located at the ends of each group, for example $G_2S_1$ and $G_2S_M$, for example by designing these as pointers pointing towards the inside of the group or by enlarging them relative to the display elements located within the group, and this proves to be a particular advantage especially when a display element at the end of a group carries the detailed data, so that an observer can immediately recognize that one end of the pointer is missing. A display element designed in this way is shown in FIG. 2b.

Furthermore, since rectangular unipolar voltage pulses which are of a constant type and merely out-ofphase are selected according to the invention, an energy source with only one voltage level is required and this is advantageous, especially with regard to the use of simple logic gates in place of bilateral switches.

Figure 3:
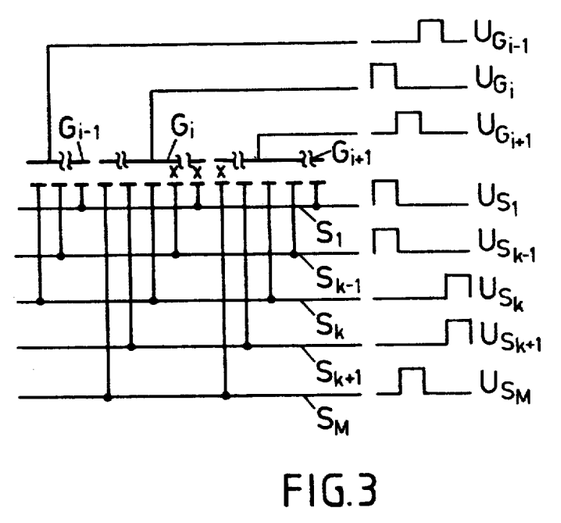
FIG. 3 shows a schematic representation of the method according to the invention for addressing a pointer consisting of three display elements, the pointer moving, with constant width, from the elements of one group to the elements of an adjacent group.

In FIG. 3 the method according to the invention is used to address a pointer consisting of three display elements, the pointer extending from the elements $G_iS_{k-1}$, $G_iS_l$ of group $G_i$ to element $G_{i+1}S_M$ of group $G_{i+1}$. In this device only pulses $U_{Gi}$ ($=U_{Sl}=U_{Sk-l}$), $U_{Gi+1}$($=U_{SM}$), $U_{Gi-l}$ and $U_{Sk}$ ($=U_{Sk+l}$) which are out of phase relative to one another and have an impulse width of at most one quarter of the period T have been applied. Of these four pulses, three, that is to say $U_{Gi}$, $U_{Gi-l}$ and $U_{Gi+1}$, are applied to the group electrodes and three are applied to the segment electrodes, for example $U_{Sl}$ ($=U_{Sk-l}$), $U_{SM}$, $U_{Sk}$ ($=U_{Sk+l}$), when the pointer moves from the elements of one group to those of an adjacent group.

Up to three-segment pointers can be used in display devices addressed in this way without the width of the pointer being altered on transition from the elements of one group to the elements of a second group. In display devices of the type in FIG. 1a, it is even possible to use pointers having a number of display elements comprising a maximum of all the elements of one group, without the width of the pointer being altered on transition from group to group.

Figure 4:
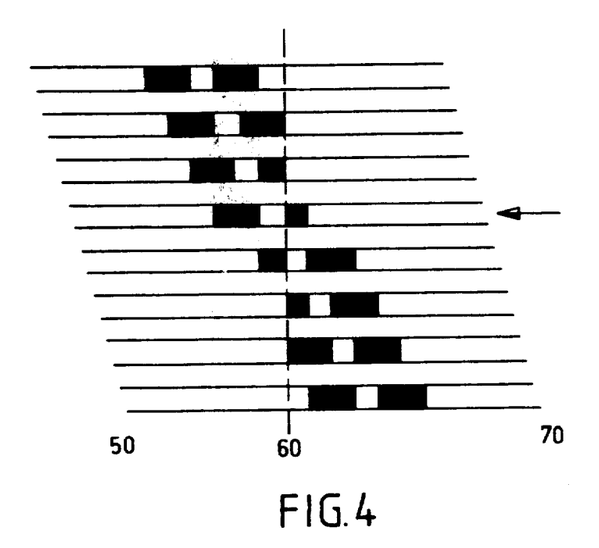
FIG. 4 shows representations of the pointer addressed by the method according to FIG. 5 during various phases of its movement from left to right by reason of the increase in the displayed variable.
Figure 5:
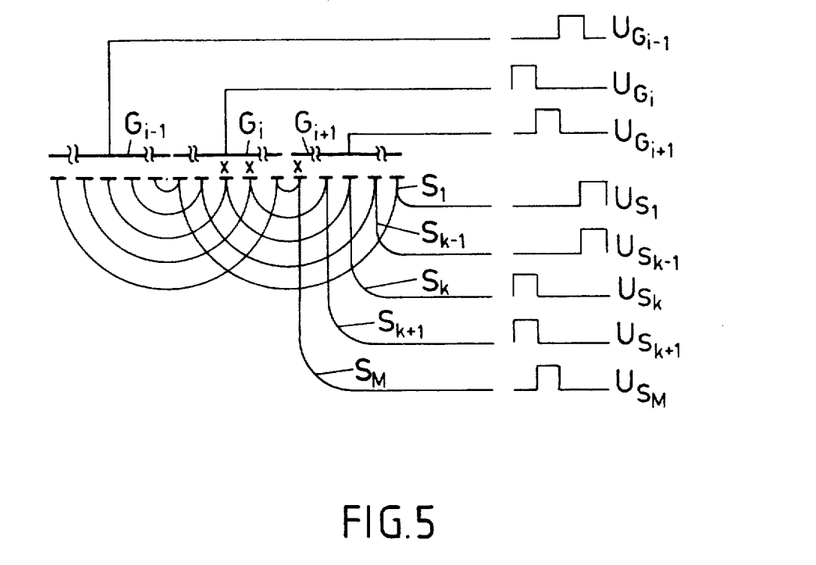
FIG. 5 shows a schematic representation of the method according to the invention for addressing a pointer which consists of five display elements and moves, in the case of a meander-type arrangement of the electrodes of the display elements, from the elements of one group to the elements of an adjacent group.

As can be seen from FIGS. 4 and 5, the method according to the invention can, however, also be employed for addressing a display device which contains a 5-segment pointer and is provided with electrodes connected in meander form, without this resulting in large losses in readability.

Figure 6:
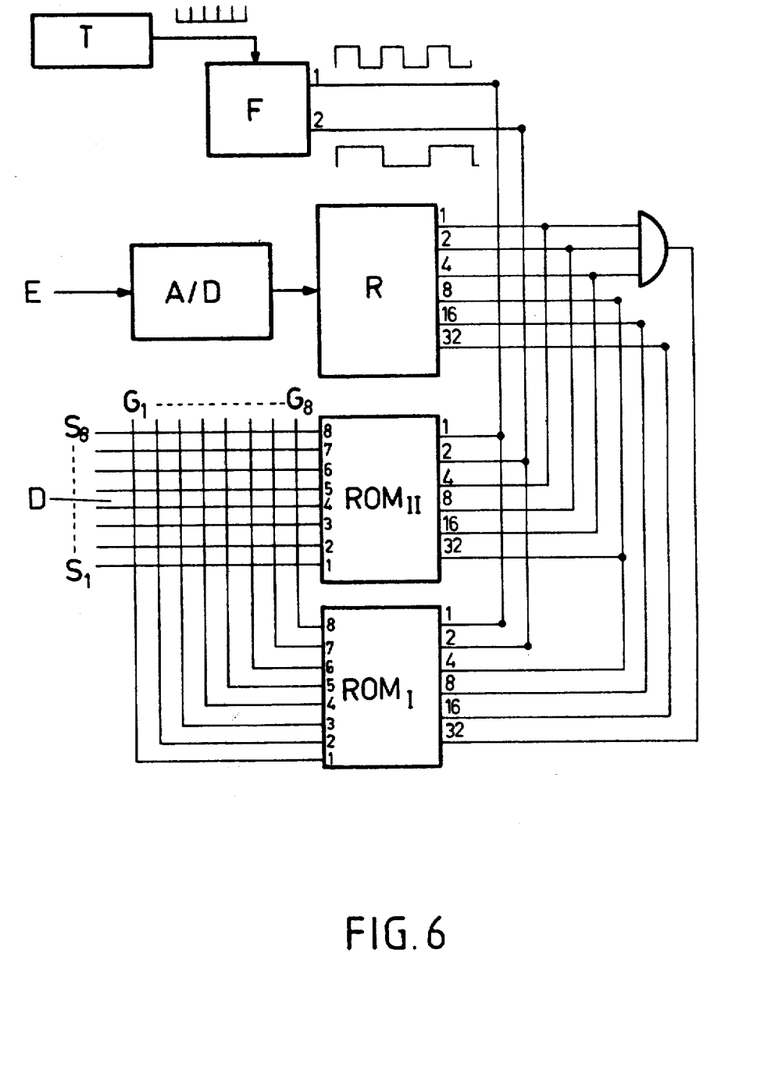
FIG. 6 shows a block diagram of the addressing circuit of an electro-optical display device having a 64-element meander-type arrangement of the electrodes of the display elements, the addressing circuit enabling the analog input data to be shown in accordance with the illustrative embodiment of the method according to the invention of FIGS. 4 and 5.

By using unipolar drive pulses, which can be generated in a simple manner by logic gates, it is also possible to use the method according to the invention for controlling pointers of complicated design, such as those of the type shown in FIGS. 4 and 5. FIG. 6 shows, by way of example, a display device for carrying out the method according to the invention in which the group electrodes $G_1, \ldots, G_8$ and the segment electrodes $S_1, \ldots, S_8$ of display D are connected directly to the outputs of two read-only memories ROM I and ROM II. The outputs $1, 2, \ldots, 8$ of these highly integrated memories assume a high or a low voltage state, depending on the data permanently stored therein and depending on the address signal fed in. The address signals are changed in a cycle, by means of the clock signals and counter signals generated in a clock generator T and frequency divider F, at a speed which is sufficiently rapid to ensure that the output pulses produce a flicker-free display. The effective value of the drive signals which are applied to the activated display elements is $U/\sqrt{2}$ where U is the high voltage level at the output of the memory. Therefore, a logical 5 V voltage level, which produces an effective voltage $U_{RmS}$ of 3.5 V on the electrodes of the display element to be activated, is adequate for twisted nematic liquid crystal displays.

Figure 7A:
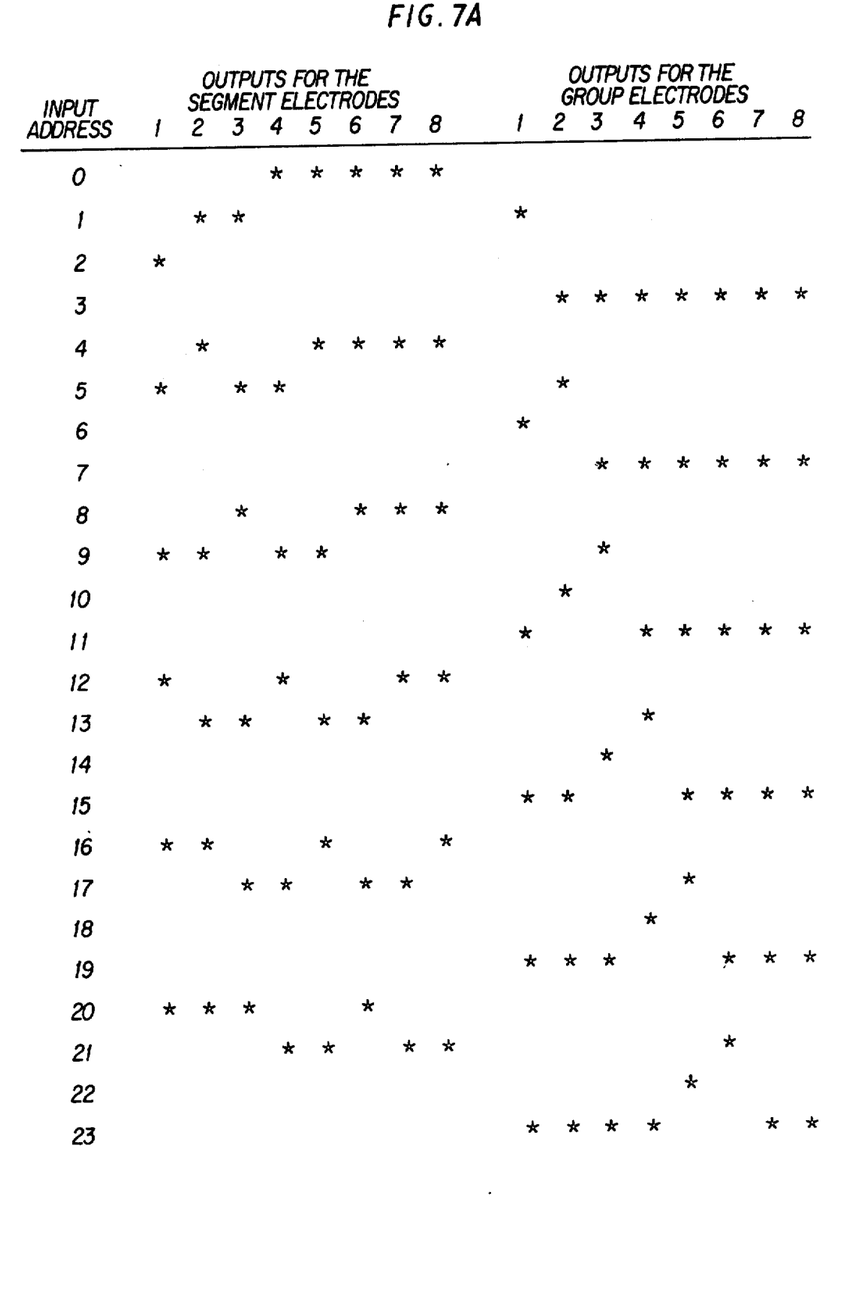
FIGS. 7a, 7b and 7c show a complete program for the ROMs in FIG. 6 to display the pattern of FIG. 4 on a 64-element display.
Figure 7B:
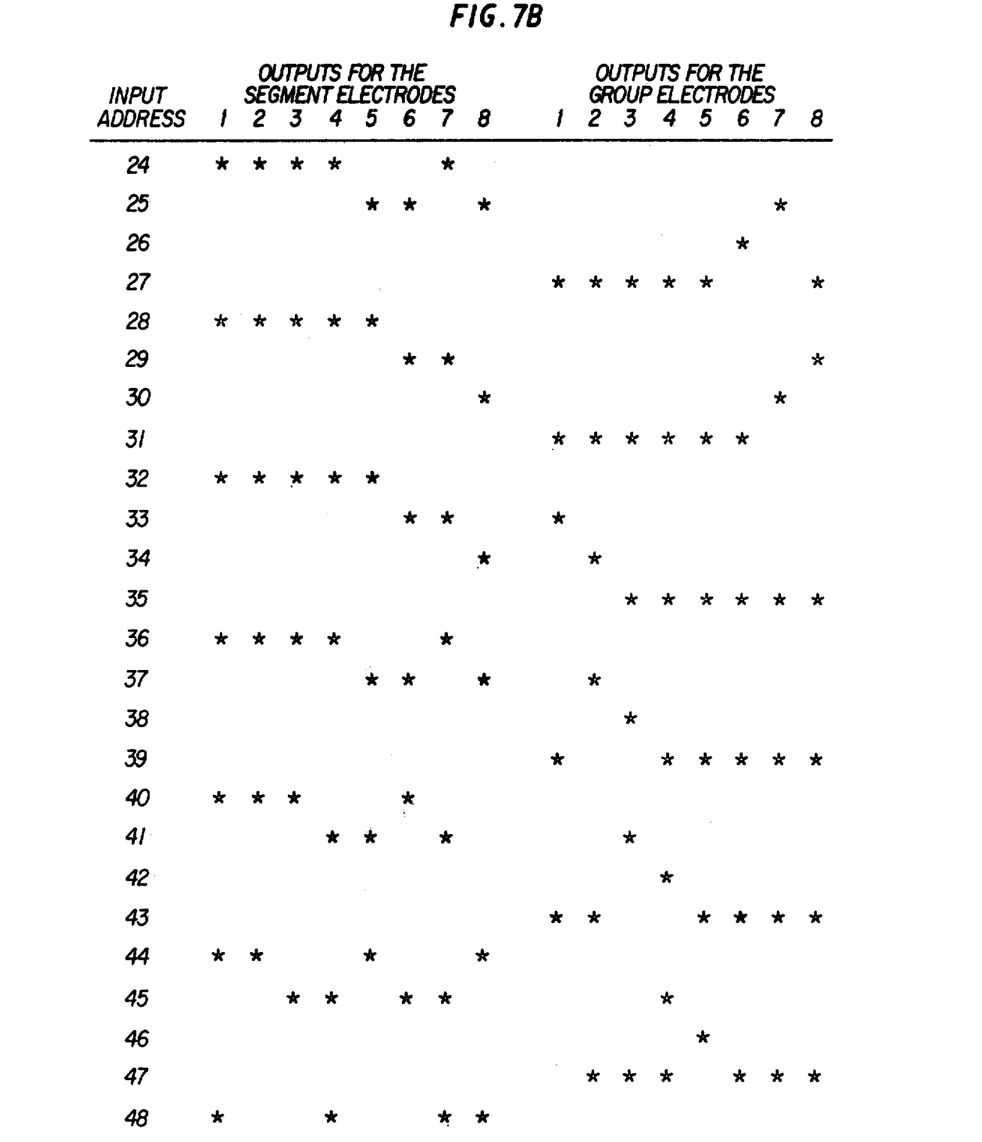
Figure 7C:
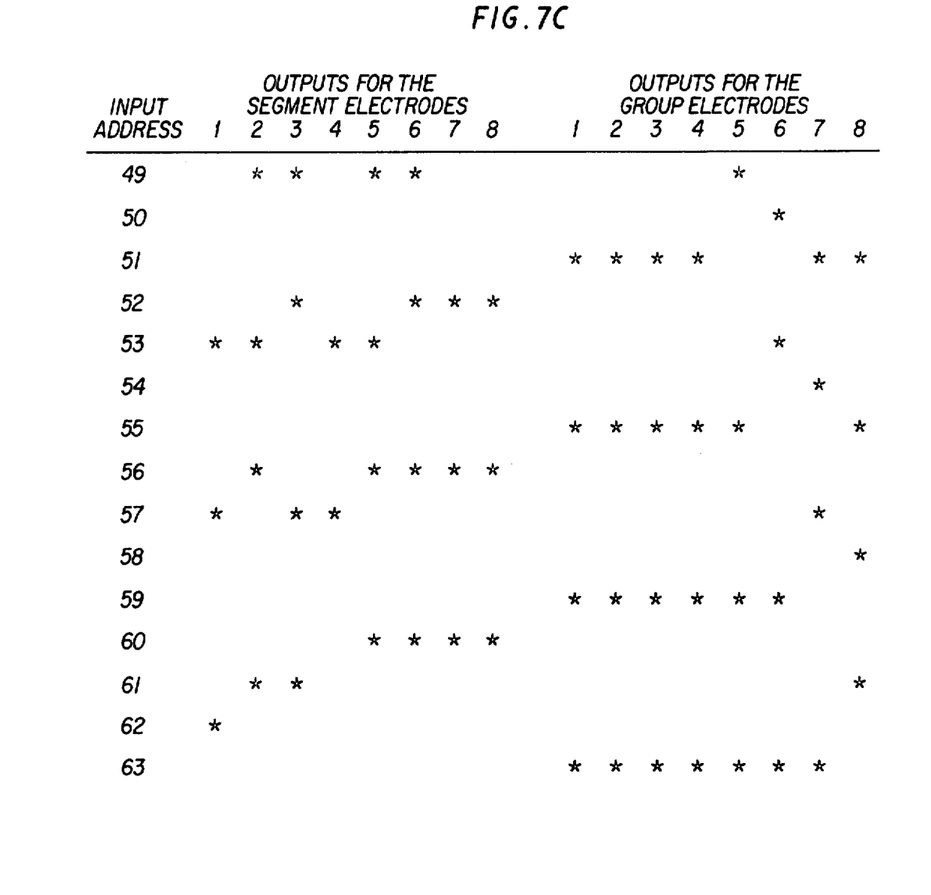

Which outputs of the read-only memories deliver pulses in a specific interval is determined by the data to be displayed. The analog signal E is recorded via an analog-to-digital converter A/D in a data store R. The data bits of low order 1, 2 and 4 contain the data relating to the segment electrodes and comprise part of the address fed to the read-only memory ROM II. The data bits of high order 8, 16 and 32 contain the data relating to the group electrodes and comprise part of the address fed to the read-only memory ROM I. In addition, the group data bit of the lowest order 8 in the case of segments connected in a meander-type manner, is also fed to read-only memory ROM II, since it can be ascertained from this whether the arrangement of the segments is reversed or not. In addition, the address of the read-only memory ROM I relating to the group electrodes must contain information on whether the multsegment pointer should move into the next higher group. A complete program for the read-only memory is given in FIGS. 7a, 7b and 7c. Using read-only memories programmed in this way, the display patterns of FIG. 4 can be reproduced with a display with 64 elements, which lie geometrically in a sequence of 8 groups in each case comprising 8 elements, the segment electrodes being connected in a meander-type manner.

In a display device in which the N group electrodes receive address pulses in a predetermined fixed sequence, as in the case of the multiplex method, the read-only memory ROM I, which contains the data from the group electrodes, can be greatly simplified or replaced by a ring counter with N+1 stages. In this case, a selected segment is pulsed in the same time interval as the group in which it is to appear, while all of the segments not selected are pulsed during the interval N+1, in which no corresponding group signal exists. The effective voltage $U_{RmS}$ generated there is $\sqrt{2/(N+1)}$. U, where U is the pulse height. In order to generate an effective voltage of 3 V, N can be up to 49 without U exceeding the value of 15 V which is a typical limit for integrated circuits.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for addressing an electro-optical display device for pointer type representation of data on a contrasting background, the display device having a display comprising a plurality of display elements adjoining one another and arranged in a row, each display element having front and rear electrodes which are opposite one another and are separated from one another by a liquid crystal, the rear electrodes being connected to one another group-wise in an electrically conducting manner and the front electrodes being connected to one another segment-wise in an electrically conducting manner comprising the steps of:
  generating at least three rectangular driving signals of the same type but mutually phase displaced by means of an addressing circuit, the rectangular driving signals being unipolar voltage pulses of the same amplitude, period and pulse width, the pulse width being at most one third of the pulse period and the phase displacement being at least equal to the pulse width;
  applying in-phase driving signals of said generated driving signals to the group electrodes and the segment electrodes of at least two display elements, separated from one another at most by one element carrying the data; and
  applying out-of-phase driving signals to the group electrode and the segment electrode of all other display elements including said one element carrying the data by use of the generated driving signals to form the background of the display, the voltage between said other group electrodes and segment electrodes being greater than the threshold voltage of the liquid crystal.

2. A method for addressing an electro-optical display device for pointer type representation of data on a contrasting background, the display device having a display comprising a plurality of display elements adjoining one another and arranged in a row, each display element having front and rear electrodes which are opposite one another and are separated from one another by a liquid crystal, the rear electrodes being connected to one another group-wise in an electrically conducting manner and the front electrodes being connected to one another segment-wise in an electrically conducting manner comprising the steps of:

generating at least three rectangular driving signals of the same type but mutually phase displaced by means of an addressing circuit, the rectangular driving signals being unipolar voltage pulses of the same amplitude, period and pulse width, the pulse width being at most one third of the pulse period and the phase displacement being at least equal to the pulse width;

applying out-of-phase driving signals of said generated driving signals to the group electrode and the segment electrode of one display element to indicate the exact position of the display pointer, the voltage between the group electrode and the segment electrode of the one display element being greater than the threshold voltage of the liquid crystal;

applying in phase driving signals of said generated driving signals to the group electrode and the segment electrodes of all other display elements having the same group electrode as the one display element to indicate the approximate position of the display pointer; and applying out-of-phase driving signals of said generated driving signals to the group and segment electrodes of all other display elements to form the background of the display.

3. A method according to claims 1 or 2, further comprising:

generating four of said rectangular driving signals of the same type but mutually phase displaced, the rectangular driving signals being unipolar voltage pulses of the same amplitude, period and pulse width, the pulse width being at most one quarter of the pulse period and the phase displacement being at least equal to the pulse width; and applying in phase driving signals of three of said generated driving signals to the group electrode and the segment electrode of each of three adjacent display elements to form a pointer, two of the display elements having different group electrodes.

* * * * *